(12) United States Patent
Jenne et al.

(10) Patent No.: US 6,709,928 B1
(45) Date of Patent: Mar. 23, 2004

(54) SEMICONDUCTOR DEVICE HAVING SILICON-RICH LAYER AND METHOD OF MANUFACTURING SUCH A DEVICE

(75) Inventors: Fred Jenne, Los Gatos, CA (US); Loren Thomas Lancaster, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/920,378

(22) Filed: Jul. 31, 2001

(51) Int. Cl.[7] .............................................. H01L 21/336
(52) U.S. Cl. .................. 438/264; 438/261; 438/591; 438/775; 438/778; 438/257
(58) Field of Search ................................ 438/264, 591, 438/778, 775, 257, 261; 257/324; 437/40, 42; 29/571

(56) References Cited

U.S. PATENT DOCUMENTS

| | | | | |
|---|---|---|---|---|
| 4,490,900 A | * | 1/1985 | Chiu ........................... | 438/591 |
| 5,464,783 A | * | 11/1995 | Kim et al. ................... | 438/591 |
| 6,020,606 A | * | 2/2000 | Liao ............................ | 257/213 |
| 6,297,173 B1 | * | 10/2001 | Tobin et al. ................. | 438/778 |
| 6,348,380 B1 | * | 2/2002 | Weimer et al. .............. | 438/257 |
| 6,406,960 B1 | * | 6/2002 | Hopper et al. .............. | 438/261 |
| 6,445,030 B1 | * | 9/2002 | Wu et al. .................... | 257/315 |

OTHER PUBLICATIONS

Ohring, M., Materials Science of Thin Films, 2nd ed. Academic, 2002, pp. 336–337.*

* cited by examiner

*Primary Examiner*—VanThu Nguyen
*Assistant Examiner*—Michael K. Luhrs
(74) *Attorney, Agent, or Firm*—Bradley T. Sako

(57) ABSTRACT

A semiconductor device and method of manufacturing a semiconductor device is disclosed in which a SONOS-type dielectric may include a charge storing dielectric (206) that includes at least one charge trapping dielectric layer (212) formed within. A charge trapping dielectric layer (212) may be a silicon-rich silicon nitride layer that may trap charge that could otherwise tunnel through a charge storing dielectric (206). A method may include forming a tunneling dielectric (302), forming a first portion of a charge storing layer (304-0), forming a charge trapping layer (306), forming a second portion of a charge storing layer (304-1), and forming a top dielectric (308).

20 Claims, 6 Drawing Sheets

SEMICONDUCTOR DEVICE HAVING SILICON-RICH LAYER AND METHOD OF MANUFACTURING SUCH A DEVICE

TECHNICAL FIELD

The present invention relates generally to dielectrics for field effect semiconductor devices, and more particularly to dielectrics for SONOS-type nonvolatile semiconductor devices.

BACKGROUND OF THE INVENTION

As is well known, semiconductor devices can include an insulated gate field effect transistor (IGFET) type device. IGFET-type devices typically include a transistor gate separated from a channel region by a dielectric. A potential applied to a gate can then be varied to alter channel conductivity.

While many IGFET type devices are volatile (e.g., conventional metal-oxide-semiconductor FETs), nonvolatile devices may also include IGFET-like approaches. One conventional nonvolatile device can be a floating gate electrically erasable programmable read only memory (EEPROM). A floating gate EEPROM can include a floating gate electrode situated between a control gate and a channel. Charge, including electrons and/or "holes" may be stored in a floating gate electrode. Such a charge may alter a threshold voltage of a resulting nonvolatile IGFET-type device. As will be noted below, a drawback to any floating gate device can be higher programming and/or erase voltages with respect to other nonvolatile approaches.

Another nonvolatile IGFET type device can include a dielectric interface to store (i.e., trap) charge. For example, devices have been proposed that include a metal gate formed over a dielectric of silicon nitride and silicon dioxide. Such devices have been referred to as metal-nitride-oxide-semiconductor (MNOS) devices. A drawback to many MNOS devices has been lack of charge retention and/or uniformity of programming.

A third type of nonvolatile device may include one or more dielectric layers for storing charge. Such devices may be referred to generally as silicon-oxide-nitride-oxide-silicon (SONOS) type devices. One very basic type of SONOS device may include a polycrystalline silicon gate formed over a dielectric layer that includes a silicon nitride layer sandwiched between silicon dioxide layers. SONOS-type devices can have lower programming voltages than other conventional nonvolatile devices, such as some types of floating gate devices.

A drawback to conventional SONOS-type devices can be lack of scalability. Scalability refers to reducing a device size with a corresponding reduction in device characteristics. If a device is "scalable" it may be readily shrunk as manufacturing technology advances. To better understand limits to conventional SONOS device scaling, an example of a conventional SONOS device and corresponding programming operation Will be described.

Referring now to FIG. 6, a SONOS-type device is shown in a side cross sectional view, and designated by the general reference character 600. A SONOS-type device may be formed on a substrate 602, and include a control gate 604 formed over a SONOS-type dielectric 606. A SONOS-type dielectric 606 may include a tunnel dielectric 608, a charge storing dielectric 610, and a top dielectric 612. A tunnel dielectric 608 may be formed from grown silicon dioxide, a charge storing dielectric 610 may be formed from silicon nitride, and a top dielectric 612 may include silicon dioxide.

A control gate 604 and SONOS-type dielectric 606 may be formed over a channel region 614 in a substrate 602. A channel region 614 may be situated between a first source/drain region 616-0 and a second source/drain region 616-1.

Ideally, in a conventional SONOS-type device 600, a programming operation may include establishing a potential between a substrate 602 and a control gate 604. Such a potential may cause electrons to tunnel from a substrate 602 through a tunnel dielectric 608 into a charge storing dielectric 610. Tunneling may continue, through a series of programming voltage pulses for example, until a predetermined amount of charge is accumulated in a charge storing dielectric 610. This accumulated charge may alter a threshold voltage for a SONOS-type device 600.

Ideally charge may accumulate within a charge storing layer 610. FIG. 7A shows one representation of an ideal programming operation. Electrons, one of which is shown as item 700, can tunnel through a tunnel dielectric 702 into a charge storing dielectric 704. FIG. 7A also includes a representation of a charge distribution 706. A representation 706 shows amount of charge (Q) with respect to vertical position. As shown by FIG. 7A, a majority of programming charge remains within a charge storing dielectric 704.

Unfortunately, it has been found that conventional SONOS-type devices may not be scaled down as a dielectric thickness is reduced. In particular, lower operating voltages may result in thinner gate dielectrics. However, as a conventional SONOS-type dielectric thickness is reduced, electrons may tunnel through both a tunnel dielectric and a charge storing layer during a programming operation.

A programming operation for a scaled down conventional SONOS-type device is represented in FIG. 7B. In FIG. 7B, electrons, one of which is shown as item 710, can tunnel through both a tunnel dielectric 712 and a charge storing dielectric 714, and be trapped at an interface between a charge storing dielectric 714 and top dielectric 716. A representation of a resulting charge distribution is shown as 718. A representation 718 shows a charge amount (Q) with respect to a vertical position. As shown by FIG. 7B, a substantial amount of programming charge can be situated at charge storing dielectric 714/top dielectric 716 interface.

Thus, as a conventional SONOS device is scaled down, a resulting programming charge may not be distributed within a charge storing dielectric. Instead such charge may be situated further from a substrate of at a higher interface between dielectric layers. Consequently, an amount of charge and/or programming time may not scale at the same rate as a reduction in dielectric thickness. In particular, more charge and/or a longer programming time may be needed to establish a proportional change in threshold voltage.

In light of the above, it would be desirable to arrive at some way of forming a SONOS-type device that may provide programming characteristics that may more readily scale down as a SONOS-type dielectric is reduced in thickness.

SUMMARY OF THE INVENTION

According to one embodiment of the present invention, a nonvolatile semiconductor device may include a nonvolatile dielectric formed between a control gate and a substrate. A nonvolatile dielectric can include a tunnel dielectric, a charge storing dielectric, and a top dielectric. A charge storing dielectric may include a charge trapping layer formed within. A charge trapping layer can trap charge that could otherwise tunnel through a charge storing dielectric.

According to one aspect of the embodiments, a charge storing dielectric can include silicon nitride, while a charge trapping layer can include silicon-rich silicon nitride.

According to another aspect of the embodiments, a charge storing dielectric may have a thickness less than 200 Å, which can allow for a nonvolatile semiconductor device to be scaled down in size.

According to another aspect of the embodiments, a tunneling dielectric and top dielectric may include silicon dioxide.

A method, according another embodiment, may include forming a tunneling dielectric, forming a first portion of a charge storing dielectric, forming a charge trapping layer, forming a second portion of a charge storing dielectric, and forming a top dielectric.

According to one aspect of the method embodiment, a tunneling dielectric may be silicon dioxide layer that is thermally grown at a slower rate than many conventional approaches.

According to another aspect of the embodiments, a first portion of charge storing layer may be silicon nitride deposited with silicon and nitrogen source materials. Flow rate ratios between these source materials may be altered to form a charge trapping layer. Flow rate ratios may be changed again to deposit a second portion of a charge storing dielectric.

DETAILED DESCRIPTION OF THE EMBODIMENTS

Various embodiments of the present invention will now be described with reference to a number of diagrams. The embodiments include a nonvolatile semiconductor device and method of manufacturing such a device. In particular embodiments, a nonvolatile semiconductor device may include a charge trapping layer formed within a charge storing layer that can prevent charge from tunneling completely through a charge storing layer. A method according to an embodiment may form such a charge storing layer in an in situ fashion.

Figure 1:
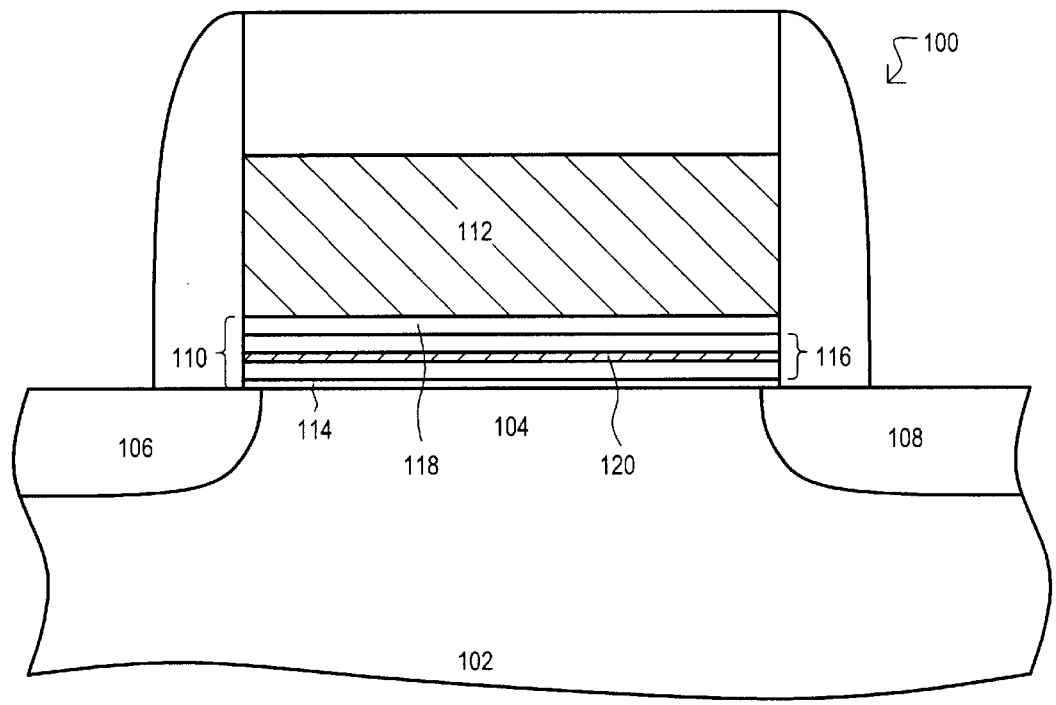
FIG. 1 is a side cross sectional view of one embodiment of the present invention.

Referring now to FIG. 1, a nonvolatile semiconductor device according to one embodiment is shown in a cross sectional view and designated by the general reference character 100. A nonvolatile semiconductor device 100 may be formed on a semiconductor substrate 102 that may include a channel region 104, a first source/drain region 106 and a second source/drain region 108. As is well known, source/drain regions (106 and 108) can be regions in a semiconductor substrate having a different conductivity type than a "bulk" portion of a semiconductor substrate 102. A nonvolatile semiconductor device 100 may also include a nonvolatile dielectric 110 between a control gate 112 and a channel region 104.

A nonvolatile dielectric 110 may include a tunneling dielectric 114, a multi-layered charge storing dielectric 116, and a top dielectric 118. A multi-layered charge storing dielectric 116, unlike a conventional charge storing dielectric, may include one or more charge trapping layers 120. A charge trapping layer 120 may be formed from a material that may trap charges that tunnel through a tunnel dielectric 114 into a multilayered charge storing dielectric 116. Such an arrangement may prevent charge from accumulating at an interface with a top dielectric layer—as can occur in a conventional approach.

In a preferred embodiment, a charge trapping layer 120 may comprise silicon-rich silicon nitride. A silicon-rich silicon nitride may include higher levels of silicon than a surrounding silicon nitride layer. More particularly, a multilayered charge storing layer 116 may include silicon nitride, while a charge trapping layer 120 may be a silicon nitride layer having higher levels of silicon than other portions of a multilayered charge storing layer 116.

It is understood that the term silicon nitride can be used to describe materials that include other elements in addition to silicon and nitrogen. Further, ratios between silicon and nitrogen may differ from stoichiometric ratios ($Si_3N_4$). As but a few of the possible examples, silicon nitride may include hydrogen $SiN_xH_y$ and/or oxygen $SiO_xN_yH_z$ (silicon oxynitride). One way of identifying such silicon nitride layers may be by a resulting refractive index. In one particular approach, a silicon nitride charge storing layer according to an embodiment may have a refractive index in the range of about 1.4 to 2.5, more particularly about 1.5 to 2.0, even more particularly about 1.88.

Figure 2A:
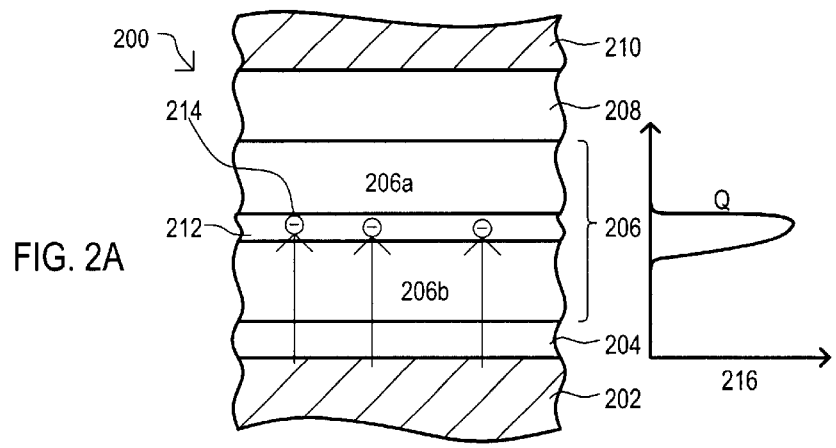
FIGS. 2A, 2B and 2C are side cross sectional views showing programming operations according to embodiments of the present invention.

FIG. 2A is a diagrammatic representation of a programming operation according to one embodiment. FIG. 2A shows a portion of a nonvolatile semiconductor device 200 according to one embodiment, including a substrate 202, tunneling dielectric 204, a charge storing layer 206, a top dielectric 208, a control gate 210, and a charge trapping layer 212 formed within a charge storing layer 206.

An electric field may be established between a substrate 202 and a control gate 210. An electric field may result in electrons, one of which is shown as item 214, tunneling through tunnel dielectric 204 and into charge storing layer 206. Such an electric field may be sufficient to enable electrons 214 to tunnel through a layer of conventional silicon nitride. However, due to a charge trapping layer 212, electrons 214 may be essentially retained within a charge storing layer 206.

A charge storing result for the embodiment of FIG. 2A is represented by graph 216. Graph 216 shows a charge amount (Q) with respect to a vertical position. As shown graph 216, a substantial amount of programming charge can be situated at charge trapping layer 212, and not at an interface between a middle charge storing dielectric 206 and a top dielectric 208.

Figure 2B:
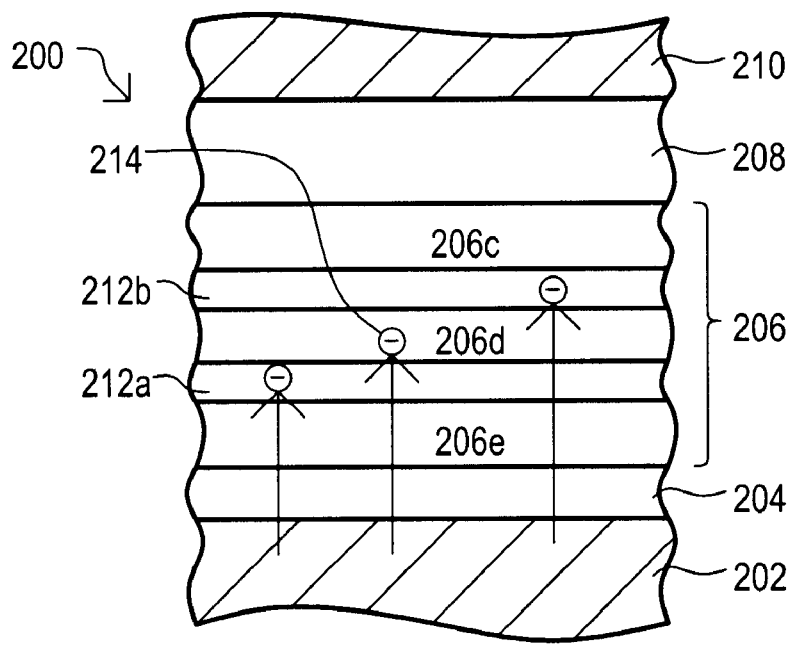

While FIG. 2A shows an example of a multilayered charge storing dielectric 206 that includes a single charge trapping layer 212, a multilayered charge storing dielectric may include multiple charge trapping layers. An example of one such embodiment is shown in FIG. 2B. FIG. 2B includes the same general constituents as FIG. 2A except that a multilayered charge storing layer 206 may include two charge trapping layers 212a and 212b. In such an arrangement, charge that may tunnel through a lower charge trapping layer 212a may be trapped by a higher charge trapping layer 212b. In this way, multiple charge trapping layers (212a and 212b) may help retain charge within a multilayered charge storing layer 206 that might otherwise tunnel through such a layer. Of course, alternate embodiments could include more than two charge trapping layers within a charge storage dielectric.

It is noted that the various charge trapping layers have been described as being formed "within" a charge storage dielectric. It is understood that charge trapping layers formed on a boundary of a charge storage dielectric can be considered as being "within" such a charge storage dielectric. To better illustrate this, another example is shown in FIG. 2C.

Figure 2C:
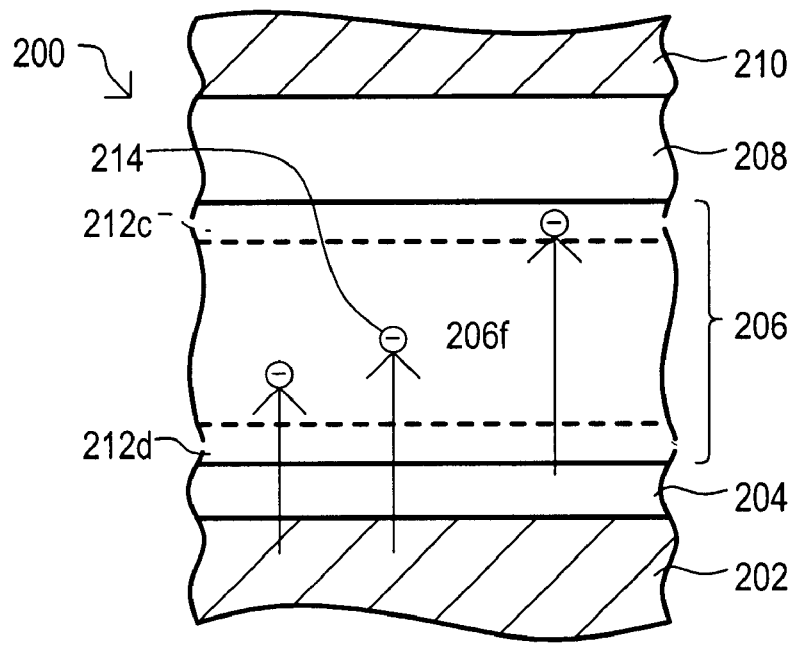

FIG. 2C includes the same general constituents as FIG. 2A except that charge trapping layers 212c and/or 212d may be formed on a boundary of a charge storing layer 206. Charge trapping layers 212c and 212d are depicted with dashed lines to indicate that a semiconductor device could include one or both boundary charge trapping layers (212c and 212d). It obviously follows, that one or more intermediate charge trapping layers could be included with a boundary charge trapping layer (212c and/or 212d).

Accordingly, particular numbers and/or placements of charge trapping layers should not necessarily be construed as limiting to the invention.

An alternate way of conceptualizing a charge trapping layer may be to view a charge trapping density of such a layer with respect to other layers of a nonvolatile semiconductor device. A charge trapping density can include how much charge a given material may trap per a unit of volume.

In particular, a charge trapping layer may be considered a layer having a greater charge trapping density than other portions of a charge storing dielectric. More particularly, if reference is made once again to FIG. 2A, a material comprising layer 212 may have a greater charge trapping density than layers 206a and 206b. Similarly, in FIG. 2B, materials comprising layers 212a and 212b may have a greater charge trapping density than layers 206c, 206d, and 206e. Likewise, in FIG. 2C, layers 212c and 212d may have a greater charge trapping density than layer 206f.

Having described various embodiments of a nonvolatile semiconductor device, methods for making such semiconductor devices will now be described.

Figure 3A:
FIGS. 3A to 3F are side cross sectional views of a method of manufacturing a dielectric layer according to one embodiment.

Referring now to FIGS. 3A–3F, a method according to one embodiment is set forth in a series of side cross sectional views. Referring now to FIG. 3A, a method may include forming a tunnel dielectric 302 over a substrate 300. A tunneling dielectric 302 may include silicon dioxide, as but one example.

Figure 3B:
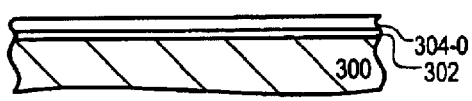

A method according to one embodiment may further include forming one portion of a charge storing layer. As shown in FIG. 3B, a first portion of a charge storing layer 304-0 has been formed over a tunnel dielectric 302. A first portion of a charge storing layer 304-0 may include silicon nitride, as but one example.

Figure 3C:

As shown in FIG. 3C, following the formation of a first part of a charge storing layer 304-0, a charge trapping layer 306 may be formed. A charge trapping layer 306, as noted above, may trap charge that could otherwise tunnel through a charge storing layer. A charge trapping layer 306 may be a layer that includes silicon-rich silicon nitride. Such a silicon-rich silicon nitride may have proportions of silicon that are greater than those of a first portion of a charge storing layer 304-0.

Figure 3D:

As shown in FIG. 3D, a method according to an embodiment may continue by forming another portion of a charge storing layer 304-1 over a charge trapping layer 306. Another portion of charge storing layer 304-1 may be formed from the same material as a first portion of a charge storing layer 304-0. In such an arrangement, a charge trapping layer 306 may be a silicon-rich layer formed within a charge trapping layer of silicon nitride.

It is noted that steps of FIGS. 3C–3D may be repeated to form more than one charge trapping layer within a charge storing layer. It is also noted that a charge trapping layer 306 may be thinner than the portions (304-0 and 304-1) of a charge storing layer.

Figure 3E:
Figure 3F:
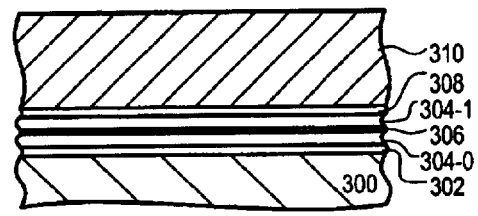

Referring to FIG. 3E, a method may continue by forming a top dielectric layer 308 over the other portion of a charge storing layer 304-1. A top dielectric 308 may include silicon dioxide, as but one example. A control gate 310 may be formed over a top dielectric 308, as shown in FIG. 3F.

It is noted that an embodiment may be conceptualized as including SONOS-type dielectric having a silicon rich layer formed in a central nitride layer. More particularly, if a tunnel dielectric 302 and top dielectric 308 are formed from silicon dioxide, and charge storing layer portions (304-0 and 304-1) are formed from silicon nitride, a charge trapping layer 306 may be a silicon-rich layer within a silicon nitride layer.

In this way, a nonvolatile gate dielectric may be formed that may trap charge, and thereby preventing such charge from accumulating at a higher dielectric layer interface.

Figure 4:
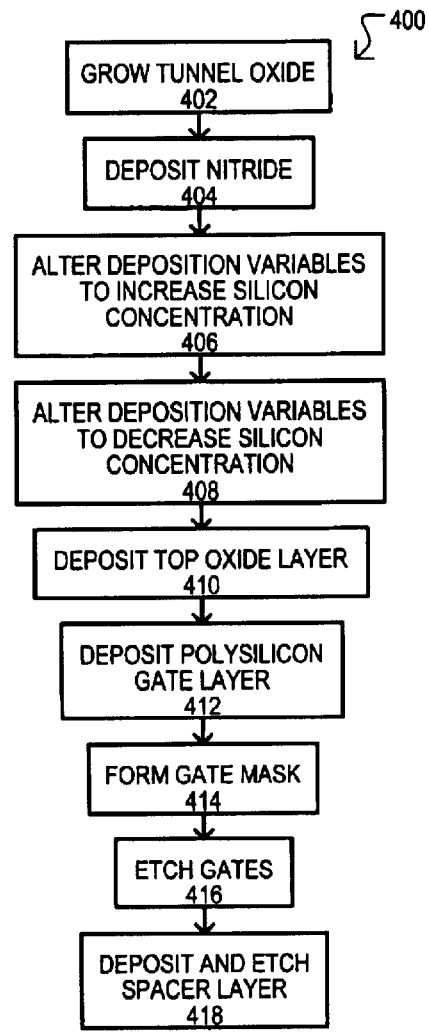
FIG. 4 is a flow diagram showing a method of manufacturing a nonvolatile semiconductor device according to another embodiment.

Having described one method according to an embodiment, a second, more detailed embodiment will now be described. A second embodiment method is set forth in FIG. 4, and designated by the general reference character 400. A method 400 may include growing a tunneling oxide (step 402). According to one embodiment, a tunneling oxide may include cleaning a semiconductor substrate to expose a silicon surface. A silicon surface may then be subjected to an oxidizing environment to form a tunneling oxide.

In one particular approach, a tunnel oxide may be formed by placing a wafer in a reaction chamber at a pressure in the general range of 400–1500 mTorr, preferably 500–1375 mTorr. An oxidizing temperature may be in the general range of 600 to 1000° C., more preferably about 800° C. Oxygen gas ($O_2$) may flow at a rate in the range of 100–300 standard cubic centimeters per second (sccm), more preferably about 200 sccm. In particular approach, oxidation may take between 1 to 3 hours, preferably 1 to 2 hours, even more preferably about 1 hour and 40 minutes. Preferably, an oxidation time may be 1 hour and 40 minutes, and may grow a tunnel oxide of about 20 Å.

The above-described particular oxidation method may be slower and at a lower temperature than other conventional approaches. It is believed that such an oxidation environment may provide tunnel oxides that may be more reliable and have repeatable tunnel oxide thickness.

Figure 5A:
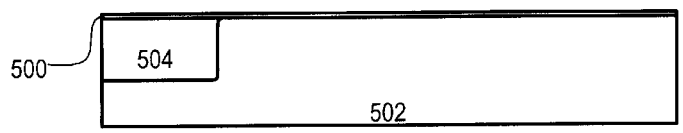
FIGS. 5A to 5H are side cross sectional views showing the method of FIG. 4.

An example of a semiconductor device following a step 402 is shown in FIG. 5A. A tunneling oxide 500 has been formed on a substrate 502. A substrate 502 may include isolation structures 504. Isolation structures 504 may be formed from silicon dioxide by shallow trench isolation (STI) and/or local oxidation of silicon (LOCOS) techniques, as but two examples. A tunneling oxide 500 may have a thickness in the general range of 10–100 Å, preferably about 10–50 Å, even more preferably about 20 Å.

In this way, a tunneling dielectric for a SONOS-type nonvolatile storage device may be formed.

A method 400 may further include depositing a layer of silicon nitride with a first set of deposition variables (step 404). However, prior to depositing nitride a reaction chamber may be purged. Such a step may include flushing a reaction chamber with nitrogen gas ($N_2$) and changing the temperature to a subsequent nitrogen deposition temperature. A flushing operation may take about 0.5 hours.

A step 404 may include a low pressure chemical vapor deposition (LPCVD) of nitrogen. Silicon nitrogen may be formed with precursor gases that include ammonia ($NH_3$), nitrous oxide ($N_2O$), and dichlorosilane (DCS).

In one particular approach, $NH_3$ flow rates may be 2–4 times greater than DCS flow rates, more preferably about 3 times greater. $N_2O$ flow rates may be 1–3 times greater than DCS flow rates, more preferably about 2 times greater. In one very particular approach, $NH_3$ flow rates may be about 150 sccm, $N_2O$ flow rates may be about 110–117 sccm, and DCS flow rates may be about 50 sccm. A chamber temperature may be in the general range of 700–800° C., more particularly about 760° C. A deposition time may be about 6.5 minutes. However, $N_2O$ preferably be initially introduced into a chamber for 1–2 minutes before other reaction gases.

Figure 5B:
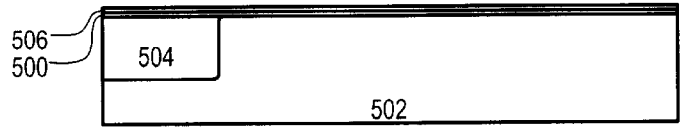

An example of a semiconductor device following a step 404 is shown in FIG. 5B. A layer of silicon nitride 506 has been formed over tunnel oxide 500. A layer of silicon nitride 506 may have a given proportion of silicon according to a first set of deposition variables, noted above. A silicon nitride layer 506 may have a thickness in the general range of 30–60 Å, preferably around 40 Å.

Once a predetermined amount of silicon nitride has been deposited according to a first set of variables, such deposition variables may be altered to increase an amount of silicon in a silicon nitride layer (step 406). In one approach, such a step may include changing flow rates of precursor gases. Preferably, a flow rate ratio between $NH_3$ and DCS may be reversed. As but one example, a flow rate ratio between $NH_3$ and DCS may be switched from about 3 to 1, to about 1 to 2–4, more particularly about 1 to 3. At the same time, $N_2O$ flows may be reduced, preferably to zero. In one very particular approach, $NH_3$ flow rates may be about 30 sccm, $N_2O$ flow rates can be 0 sccm, and DCS flow rates may be about 90 sccm. A change in flow rates may be maintained for about 1.5 minutes, for a resulting silicon-rich silicon nitride layer thickness of about 15 Å.

Figure 5C:

An example of a semiconductor device following a step 406 is shown in FIG. 5C. A layer of silicon-rich silicon nitride 508 has been formed over silicon nitride layer 506. A silicon-rich layer of silicon nitride 508 may have a higher percentage of silicon than silicon nitride layer 506. A silicon-rich silicon nitride layer 506 may have a thickness in the general range of 10–20 Å, preferably about 15 Å.

Having formed a silicon-rich layer of silicon nitride, that may serve as a charge trapping layer, deposition variables may altered once again to decrease an amount of silicon in a silicon nitride layer (step 408). Such a step may include changing deposition variables back to those of step 404. A deposition time may be about 6.5 minutes.

Figure 5D:

An example of a semiconductor device following a step 408 is shown in FIG. 5D. A layer of silicon nitride 510 has been formed over silicon-rich silicon nitride layer 508. A silicon nitride layer 510 may have a lower percentage of silicon than a silicon-rich silicon nitride layer 508. A silicon nitride layer 508 may have a thickness in the general range of 30–60 Å, preferably around 40 Å.

It is understood that while the embodiment shown in FIGS. 4 and 5A to 5D), show a nonvolatile device with a single silicon rich layer, steps 406 and 408 may be repeated to form multiple silicon-rich silicon nitride layers, if desired. Such an arrangement may provide greater charge trapping capabilities than a single layer of silicon-rich silicon nitride. Still further, while the above embodiment has positioned a silicon-rich silicon nitride layer in a central position within a silicon nitride layer, such a silicon-rich layer may be formed by changing depositions variables sooner (for a silicon-rich layer closer to a substrate), or later (for a silicon-rich layer further from a substrate).

In this way, a charge storing dielectric for SONOS-type nonvolatile storage devices may be formed that includes one or more silicon-rich silicon nitride layer.

A method 400 may continue by depositing a top layer of silicon dioxide (step 410). However, prior to depositing nitride a reaction chamber may be purged once again. Such a step may include flushing a reaction chamber with nitrogen gas ($N_2$) and changing the temperature, if necessary, to a subsequent silicon dioxide deposition temperature. A flushing operation may take about 0.5 hours.

In one approach, a step 410 may include chemical vapor deposition of silicon dioxide with precursor materials of $N_2O$ and DCS. $N_2O$ flow rates may be 2.5 to 3.0 times greater than a DCS rate, more preferably about 2.86 times greater. In one very particular approach, $N_2O$ flow rates may be about 40 sccm and DCS flow rates may be about 14 sccm. A chamber temperature may be in the general range of 700–800° C., more particularly about 760° C. A deposition time may be about 15 minutes.

Figure 5E:

An example of a semiconductor device following a step 410 is shown in FIG. 5E. A top layer of silicon dioxide 512 is shown formed over a silicon nitride layer 510. A silicon dioxide layer 510 may have a thickness in the general range of 20–60 Å, preferably about 40 Å.

In this way, a top dielectric layer for SONOS-type nonvolatile storage devices may be formed.

Figure 5F:
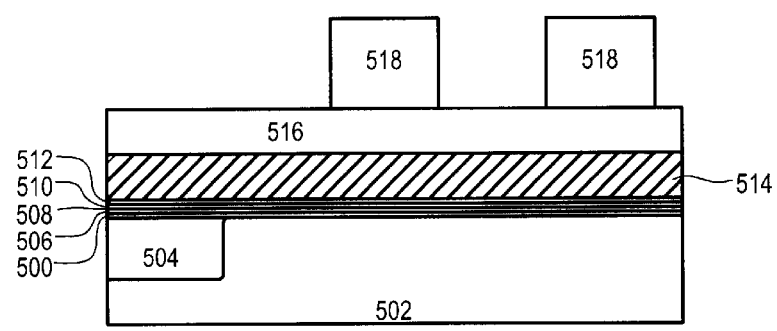

Once a SONOS-type dielectric has been formed, a polycrystalline and/or amorphous silicon (referred to herein as polysilicon) layer may be deposited on the SONOS-type dielectric (step 412). An example of a semiconductor device following a step 412 is shown in FIG. 5F. A polysilicon layer 514 may have a thickness in the general range of 1,000 to 2,500 Å, preferably about 2,000 Å.

It is noted that a method 400 may also include forming a top insulating layer over a polysilicon layer. Such a layer is shown in FIG. 5F as item 516. A top insulating layer may comprise nitride, oxynitride, or preferably silicon dioxide.

Once SONOS-type device layers have been formed (e.g., a tunnel dielectric, charge storing dielectric, top dielectric, and control gate layer), a gate mask may be formed (step 414). A step 414 may include conventional photolithography steps, such as depositing a layer of photoresist and selectively developing portions of the layer. Undeveloped portions may then be removed.

An example of a semiconductor device following a step 412 and 414 is shown in FIG. 5F. Gate masks 518 can be formed over a polysilicon layer 514 at locations where a gate or interconnect structure is desired.

Once a gate mask has been formed, gate structures may be etched (step 416). Etching gates may include reactive ion etching with gate masks as etch masks. Such a step may form gate stacks that include a top control gate, and SONOS-type dielectric with charge trapping layer.

Figure 5G:
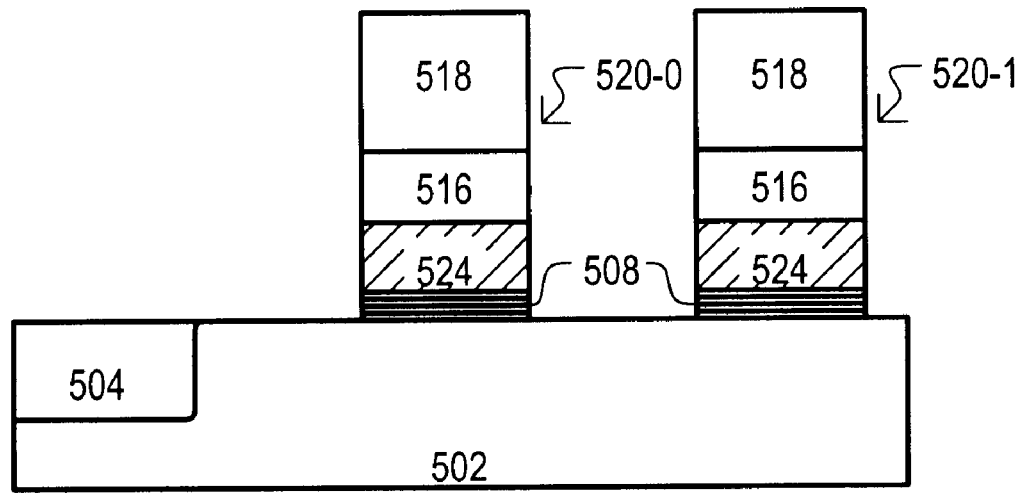

An example of a semiconductor device following a step 416 is shown in FIG. 5G. Etching may create gate stacks 520-0 and 520-1. A gate stack 520-1 may include a SONOS-type dielectric 522 formed between a control gate 524 and substrate 502. A SONOS-type dielectric 522 may include a charge trapping layer 508.

It is noted that following the formation of gate stack 520-1, one or more ion implantation steps may occur to form all or a portion of source drain regions. As but one example, a lightly doped region (e.g., and LDD region) may be formed.

A spacer layer may then be deposited over a gate stack (step 418). A spacer layer may comprise silicon dioxide. In one approach, a spacer layer may be formed with tetraethylorthosilicate (TEOS) to a thickness of about 800–2,000 Å, more preferably about 900–1,500 Å, even more preferably about 1,100 Å. Such a spacer layer may then be etched back with an anisotropic etch, such as reactive ion etching (RIE), to from insulating sidewalls.

Figure 5H:
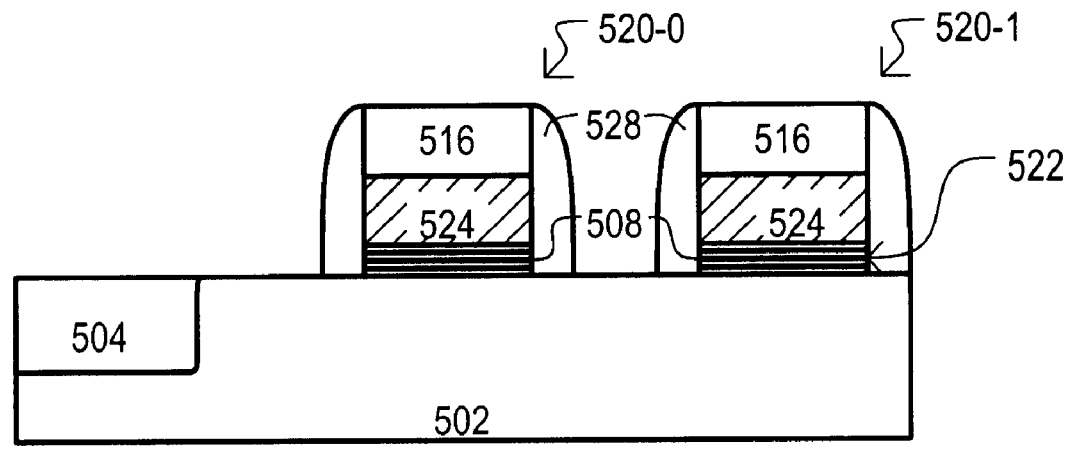
Figure 6:
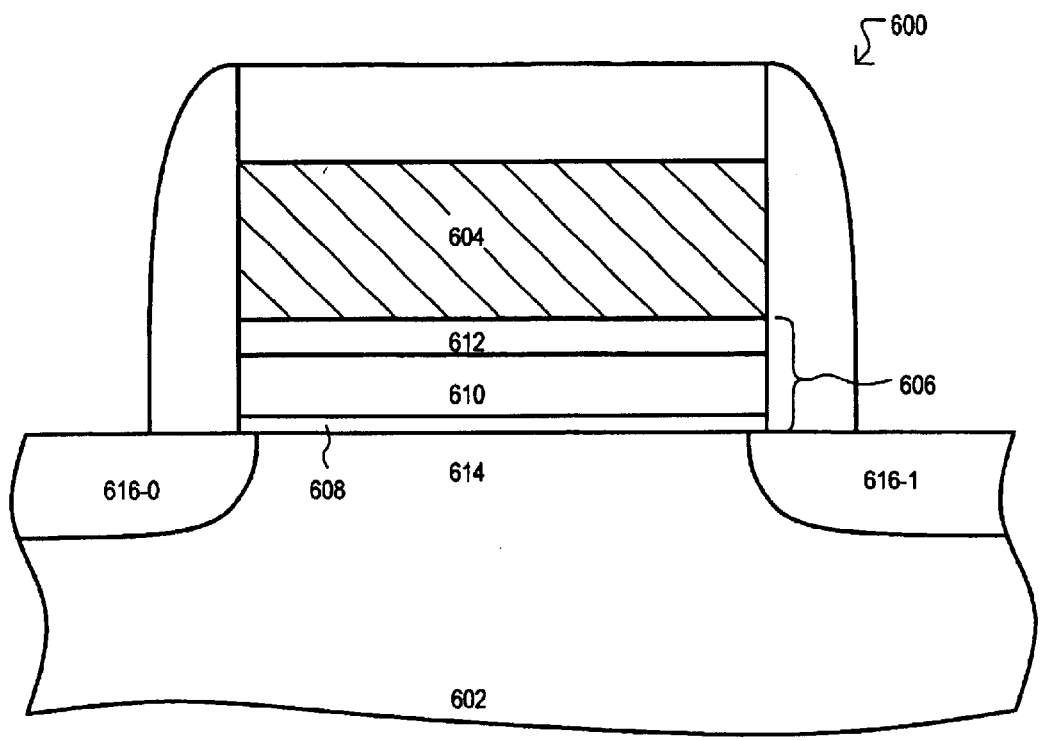
FIG. 6 is a side cross sectional view of a conventional nonvolatile semiconductor device.
Figure 7A:
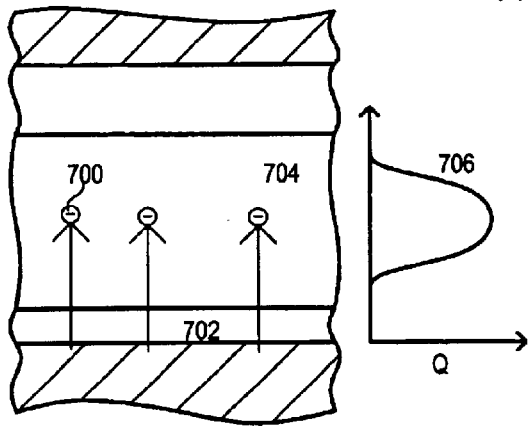
FIGS. 7A and 7B are side cross sectional views of programming operations for the conventional nonvolatile semiconductor device of FIG. 6.
Figure 7B:
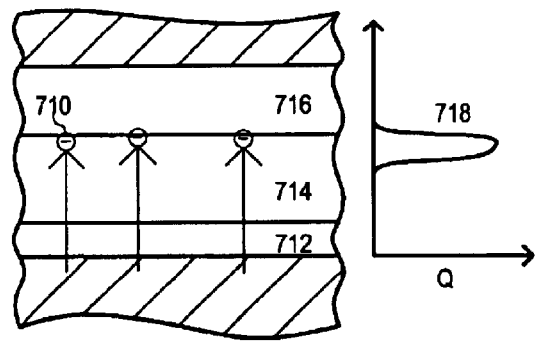

An example of a semiconductor device following a step 418 is shown in FIG. 5H. Insulating sidewalls 528 can be formed on sides of gate stacks 520-0/1. A resulting structure may comprise a one transistor (1T) SONOS-type nonvolatile storage device. Such devices may advantageously occupy a smaller area than other nonvolatile approaches. In addition, the inclusion of a silicon-rich silicon nitride layer may enable such devices to be scaled to smaller dimensions than conventional SONOS approaches.

It is understood that while various embodiments have been described in detail, the present invention could be subject various changes, substitutions, and alterations without departing from the spirit and scope of the invention. Accordingly, the present invention is intended to be limited only as defined by the appended claims.

What is claimed is:

1. A method of forming a semiconductor device insulating layer, comprising the steps of:
   forming a tunneling dielectric; and
   forming a charge storing dielectric comprising a silicon nitride layer formed on the surface of the tunneling dielectric, the charge storing dielectric including a charge trapping dielectric layer having a greater percentage of a first type element than the charge storing dielectric.

2. The method of claim 1, wherein:
   the first type element is silicon.

3. The method of claim 2, wherein:
   the charge trapping dielectric layer has a greater ratio of silicon to nitrogen than the charge storing dielectric.

4. The method of claim 3, wherein:
   forming the charge storing dielectric includes introducing a silicon containing material and a nitrogen containing material into a reaction chamber; and
   forming the at least one charge trapping dielectric layer includes increasing the flow rate of the silicon containing material with respect to the flow rate of the nitrogen containing material.

5. The method of claim 3, wherein:
   forming the charge storing dielectric includes introducing a silicon containing material and nitrogen containing material at a first flow rate ratio; and
   forming the at least one charge trapping dielectric includes increasing the flow rate ratio with respect to the silicon containing material for a second flow rate ratio.

6. The method of claim 5, wherein:
   the first flow rate ratio is at least 1:2, and the second flow rate ratio is at least 2:1.

7. The method of claim 5, wherein:
   the first flow rate ratio is at least 1:3.

8. The method of claim 5, wherein:
   the second flow rate ratio is at least 3:1.

9. The method of claim 1, further including:
   forming a top dielectric over the charge storing dielectric.

10. The method of claim 9, wherein:
    the tunneling dielectric comprises silicon dioxide;
    the charge storing dielectric comprises silicon nitride; and
    the top dielectric comprises silicon dioxide.

11. The method of claim 9, further including:
    forming a layer of polysilicon over the top dielectric.

12. The method of claim 1, wherein:
    forming the at least one charge trapping dielectric layer includes forming a plurality of charge trapping layers separated from one another by the charge storing dielectric.

13. The method of claim 1, wherein:
    the at least one charge trapping dielectric layer, is formed on a boundary of the charge storing dielectric.

14. A method of fabricating a nonvolatile semiconductor device, comprising the steps of:
    forming an insulated gate field effect dielectric layer having a multilayered charge storing dielectric formed between a tunneling dielectric and top dielectric, the multilayered charge storing dielectric comprising at least two different non-oxide dielectric materials.

15. The method of claim 14, wherein:
    the thickness of the multilayered charge storing dielectric is less than 200 Å.

16. The method of claim 14, wherein:
    the thickness of the multilayered charge storing dielectric is less than 120 Å.

17. The method of claim 14, wherein:
    the multilayered charge storing dielectric includes at least a first layer of silicon nitride formed over the tunneling dielectric and at least a second layer of silicon nitride formed over the first layer, the second layer having a different ratio of silicon-to-nitrogen than the first layer.

18. The method of claim 17, wherein:
    the second layer has a greater ratio of silicon-to-nitrogen than the first layer.

19. The method of claim 17, wherein:
    the thickness of the second layer is less than 50 Å.

20. The method of claim 17, wherein:
    the thickness of the second layer is less than 20 Å.

* * * * *